(12) United States Patent
Uemura et al.

(10) Patent No.: US 7,095,059 B2
(45) Date of Patent: Aug. 22, 2006

(54) GROUP III NITRIDE COMPOUND SEMICONDUCTOR DEVICE

(75) Inventors: Toshiya Uemura, Aichi (JP); Atsuo Hirano, Aichi (JP); Shigemi Horiuchi, Aichi (JP)

(73) Assignee: Toyoda Gosei Co., Ltd., Aichi (JP)

(*) Notice: Subject to any disclaimer, the term of this patent is extended or adjusted under 35 U.S.C. 154(b) by 0 days.

(21) Appl. No.: 10/220,878

(22) PCT Filed: May 6, 2001

(86) PCT No.: PCT/JP01/01736

§ 371 (c)(1),
(2), (4) Date: Sep. 6, 2002

(87) PCT Pub. No.: WO01/67524

PCT Pub. Date: Sep. 13, 2001

(65) Prior Publication Data

US 2003/0025115 A1     Feb. 6, 2003

(30) Foreign Application Priority Data

Mar. 7, 2000  (JP) ............................. 2000-06223

(51) Int. Cl.
*H01L 33/00* (2006.01)
(52) U.S. Cl. .................... 257/99; 257/79; 257/94; 257/98; 257/103
(58) Field of Classification Search ............ 257/13, 257/79, 80, 82, 89, 93, 98, 99, 103, 91
See application file for complete search history.

(56) References Cited

U.S. PATENT DOCUMENTS

| | | | |
|---|---|---|---|
| 5,164,955 A * | 11/1992 | Meyers ...................... 372/96 |
| 5,563,422 A | 10/1996 | Nakamura et al. | |
| 5,652,434 A | 7/1997 | Nakamura et al. | |
| 5,767,581 A | 6/1998 | Nakamura et al. | |
| 5,877,558 A | 3/1999 | Nakamura et al. | |
| 5,990,500 A * | 11/1999 | Okazaki ...................... 257/99 |
| 6,008,539 A | 12/1999 | Shibata et al. | |
| 6,093,965 A | 7/2000 | Nakamura et al. | |
| 6,281,524 B1 * | 8/2001 | Yamamoto et al. ........... 257/99 |
| 6,414,339 B1 * | 7/2002 | Tsutsui ........................ 257/99 |
| 6,417,525 B1 * | 7/2002 | Hata ............................ 257/91 |
| 6,468,676 B1 * | 10/2002 | Ueda et al. ................ 428/690 |
| 6,734,468 B1 * | 5/2004 | Uemura et al. ............... 257/99 |

(Continued)

FOREIGN PATENT DOCUMENTS

DE     19820777     11/1998

(Continued)

*Primary Examiner*—Wael M. Fahmy
*Assistant Examiner*—Wai-Sing Louie
(74) *Attorney, Agent, or Firm*—McGinn IP Law Group, PLLC

(57) ABSTRACT

The present invention provides a Group III nitride compound semiconductor device in which the amount of a current allowed to be applied on a p-type pad electrode can be increased.

That is, in the Group III nitride compound semiconductor device according to the present invention, a portion of a translucent electrode coming in contact with a circumferential surface of the p-type pad electrode is formed as a thick port ion to thereby increase the area of contact between the circumferential surface and the translucent electrode to thereby increase the current allowed to be applied on the p-type pad electrode. In addition, the use of the thick portion prevents cracking from occuring between the translucent electrode and the circumferential surface of the pad electrode.

32 Claims, 5 Drawing Sheets

U.S. PATENT DOCUMENTS

2002/0000643 A1   1/2002   Uemura et al.

FOREIGN PATENT DOCUMENTS

| EP | 0845818 | 11/1997 |
| EP | 0926744 | 12/1998 |
| JP | 09-129919 | 5/1997 |
| JP | 09-320984 | 12/1997 |
| JP | 10-242517 | 9/1998 |
| JP | 10-242518 | 9/1998 |
| JP | 11-150297 | 6/1999 |

* cited by examiner

HEATING/O₂

GROUP III NITRIDE COMPOUND SEMICONDUCTOR DEVICE

TECHNICAL FIELD

The present invention relates to a Group III nitride compound semiconductor device. More specifically, it relates to improvement in a p-type translucent electrode of a Group III nitride compound semiconductor device.

BACKGROUND ART

In a Group III nitride compound semiconductor light-emitting device such as a blue light-emitting diode, especially, in a light-emitting device having a substrate disposed on a lower side, a thin translucent electrode is formed on an almost whole surface of a p-type contact layer having relatively large resistance in order to distribute a current into the p-type contact layer evenly to thereby obtain uniform light emission form the whole area of a light-emitting layer. Because wire-bonding cannot be applied directly to such a thin translucent electrode, a pad electrode is formed thereon (see Japanese Unexamined Patent Publication No. JP-A-H09-320984, and so on).

The present inventors have made an examination of further reduction in thickness of the translucent electrode to enhance light transmittance of the translucent electrode. As a result, the following problem to be solved has been found.

That is, as described in the aforementioned patent publications, it is necessary to apply a heat treatment in order to secure ohmic contact between the translucent electrode and the p-type contact layer, secure translucency of the translucent electrode and further secure adhesion of the pad electrode to the translucent electrode and the p-type contact layer. It is conceived that when the heat treatment is carried out, the material of the pad electrode and the material of the translucent electrode are alloyed so that the pad electrode and the translucent electrode are substantially integrated with each other. Hence, a circumferential surface of the pad electrode becomes a surface connected to the translucent electrode.

Incidentally, the p-type contact layer made of a Group III nitride compound semiconductor is different in linear expansion coefficient of formation material from the translucent electrode/pad electrode (p-type electrode structure) integrated with each other by the heat treatment. Because the linear expansion coefficient of the latter made of metal is higher than that of the former, tensile stress occurs in the p-type electrode structure after the heat treatment. For this reason, there is a possibility that the interface between the circumferential surface of the pad electrode and the translucent electrode may crack because this portion is inferior in mechanical strength. Because it is conceived that the current allowed to be applied to the pad electrode (allowable current) is proportional to the area of contact between the pad electrode and the translucent electrode, the allowable current is reduced if there is such a crack. While both greater reduction in chip size and improvement in efficiency of light emission to the outside are required, reduction in size of the pad electrode is also required. On the other hand, maintenance of the status quo of the allowable current or increase of the allowable current is required. It is however impossible to satisfy these requirements if there is such a crack. This is because the area of contact between the pad electrode and the translucent electrode is not sufficient.

Moreover, because the area of contact between the translucent electrode and the circumferential surface of the pad electrode is reduced in the case were reduction in thickness of the translucent electrode advanced, this point is also a factor to cause limitation in the allowable current.

In order to examine the life and durability, a high current may need to be applied to the light-emitting device under a high-temperature environment. In this case, if there is a crack between the circumferential surface of the pad electrode and the translucent electrode, the allowable current is limited as described above. There is therefore a Possibility that originally required stringent examination cannot be executed because the current allowed to be applied at the time of examination is limited. In addition, there may be a disadvantage that burning or the like occurs in the cracking portion at the time of execution of examination so that durability of other members of the light-emitting device cannot be substantially examined any more. This means that long-term durability is poor in the case where a high current is applied under a high-temperature environment such as the outdoors.

DISCLOSURE OF THE INVENTION

As described above, the linear expansion coefficient difference between the p-type contact layer and the p-type electrode structure constituted by a combination of the pad electrode and the translucent electrode causes cracking in the interface between the circumferential surface of the pad electrode and the translucent electrode. As a result, the area of contact between the two is reduced to thereby bring about the aforementioned various problems. The invention is to solve the aforementioned problems found newly by the inventors. The configuration of the invention is as follows. That is, a Group III nitride compound semiconductor device has a translucent, electrode including a portion which comes in contact with a circumferential surface of a p-type pad electrode and which is formed as a thick portion.

According to the Group III nitride compound semiconductor device configured in this manner, the portion of the translucent electrode coming in contact with the circumferential surface of the p-type pad electrode is made thick, so that the area of a joint surface between the translucent electrode and the circumferential surface of the pad electrode is increased, compared with the translucent electrode having no thick portion. Because it is inferred that the allowable current is proportional to the area of the joint surface between the translucent electrode and the circumferential surface of the pad electrode, the current allowed to be applied to the pad electrode is increased in the device according to the present invention in which the thick portion is provided.

In addition, because adhesion (mechanical strength) between the translucent electrode and the circumferential surface of the pad electrode is strengthened by the presence of the thick portion, any crack hardly occurs between the two. Also from this point of view, the allowable current is prevented from being limited.

From another aspect, the invention can be also grasped as follows. That is, a translucent electrode in a Group III nitride compound semiconductor device wherein a portion which comes in contact with a circumferential surface of a p-type pad electrode is formed as a thick portion.

The configuration of the invention grasped from a further aspect is as follows. That is, a p-type electrode structure constituted by a translucent electrode and a pad electrode formed on a p-type semiconductor layer in a Group III nitride compound semiconductor device, has a feature in that a portion of the translucent electrode coming in contact with a circumferential surface of the pad electrode is formed as a thick portion.

The configuration of the invention grasped from an aspect of a producing method is as follows. That is, a method of producing a Group III nitride compound semiconductor device, has the steps of: forming a translucent electrode material layer on a p-type semiconductor layer; forming a thick portion material layer on the translucent electrode material layer; and forming a p-type pad electrode material layer smaller in diameter than the thick portion material layer on the thick portion material layer.

Further, the configuration of the invention grasped from another aspect as as follows. That is, a method of producing a p-type electrode structure in a Group III nitride compound semiconductor device, has the steps of: forming a thick portion material layer on a translucent electrode material layer; and forming a p-type pad electrode material layer smaller in diameter than the thick portion material layer on the thick portion material layer

PREFERRED EMBODIMENTS FOR CARRYING OUT THE INVENTION

Members of the invention will be described below in detail.

Figure 1A:
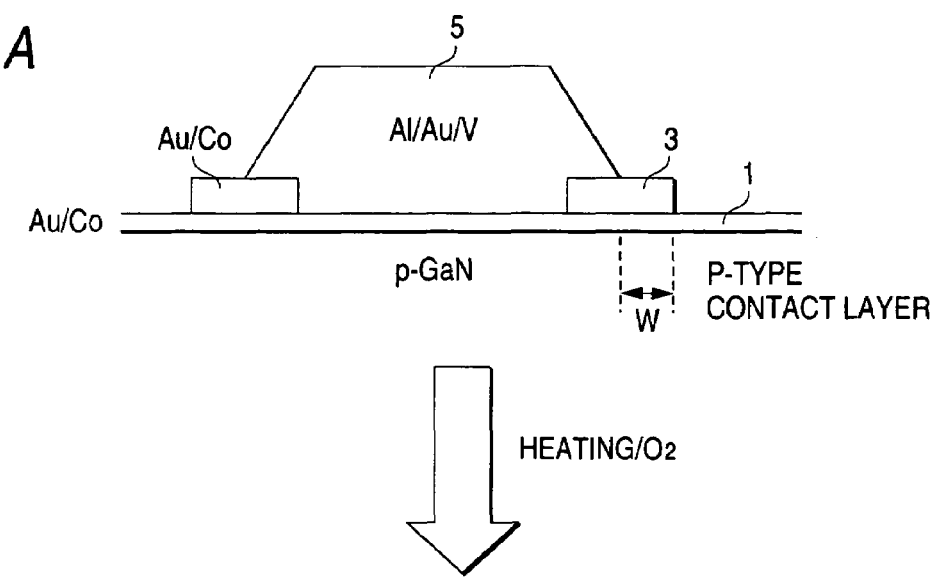
FIG. 1A and 1B show a method for producing a p-type electrode structure as an embodiment of the invention.
Figure 1B:
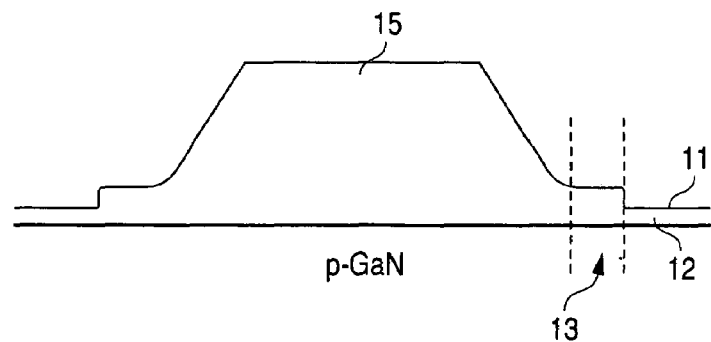

As shown in FIG. 1B, a translucent electrode 11 has a thick portion 13 connected to a circumferential surface of a pad electrode 15, and a thin portion 12 as the remainder.

The thickness and material of the thin portion 12 are not particularly limited but it is preferable that the thin portion 12 is made of a translucent material such as a gold alloy and is made as thin as possible from the point of view of transmitting light in the case of a light-emitting device. For example, in the case of a gold alloy, the thickness of the thin portion 12 is preferably set to be in a range of from 4 to 40 nm, more preferably in a range of from 4 to 30 nm, further preferably in a range of from 4 to 15 nm, most preferably in a range of front 4 to 10 nm.

The thickness of a thickest portion (a portion joined to the pad electrode 15) of the thick portion 13 is preferably set to be in a range of from 1.5 times to 15 times, more preferably in a range of from 1.5 times to 10 times, further preferably in a range of from twice to 8 times, most preferably in a range of from twice to 6 times as large as the thickness of the thin portion 13.

The material of the thick portion 13 is not particularly limited but it is preferable that the thick portion 13 is made of the same kind of material as the material of the pad electrode in order to ensure strong adhesion to the pad electrode. Similarly, because the thick portion 13 needs strong adhesion to the thin portion 13, it is preferable that the material of the thick portion 13 is made of the similar kind of material as the material of the thin portion 12. Specifically, when the thin portion 12 is made of a gold alloy and the seal electrode 15 is also made of a gold alloy, the thick portion 13 is similarly made of gold or a gold alloy. Incidentally, in this embodiment, both the thick portion 13 and the thin portion 12 are made of a cobalt-gold alloy.

The shape of the pad electrode 15 is not particularly limited if an electrically conductive wire can be bonded onto a top portion of the pad electrode 15. Incidentally, when an indented portion is formed in a circumferential surface of the pad electrode 15, a large allowable current is obtained.

The indented portion of the pad electrode will be described below.

Figure 4:
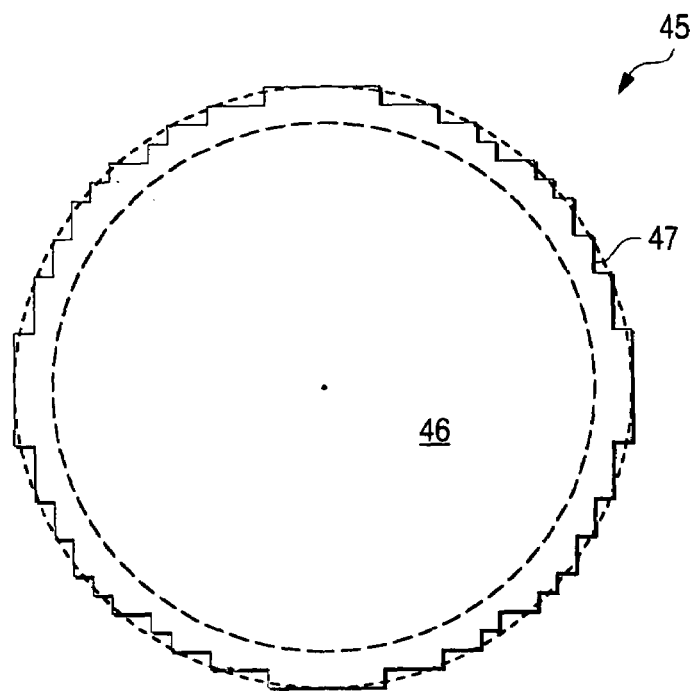
FIG. 4 is a plan view showing a p-type pad electrode as another embodiment.
Figure 5:
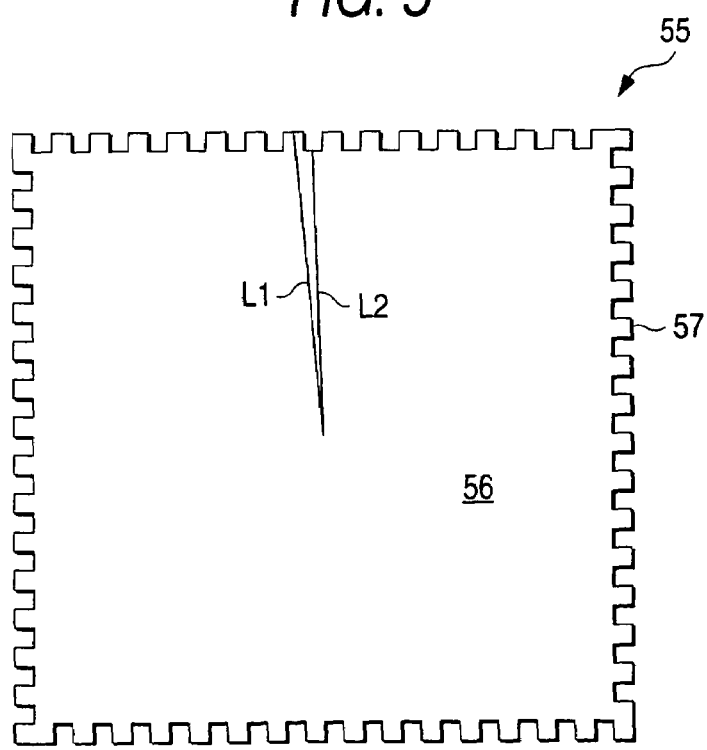
FIG. 5 is a plan view showing a p-type pad electrode as a further embodiment.

In this case, as shown in FIG. 4, the pad electrode 45 is constituted by a combination of a base portion 46 and an indented portion 47 around the base portion 46. An electrically conductive wire is bonded to the base portion 46. In the drawing, the dotted line is given to designate the boundary between the bass portion 46 and the indented portion 47 but the boundary between the two cannot be decided clearly. For example, on the assumption that the base portion 46 is defined on the basis of a virtual line (chain double-dashed line) connecting outward end portions of the indented portion 47 to one another, provision of concave portions in the base portion may be regarded as resulting in formation of the indented portion in the circumferential surface of the pad electrode 45. In short, the shape of the base portion 46 is not particularly limited if the base portion 46 can have an area sufficient to bond an electrically conductive wire. As shown in FIG. 5, it may be formed as a square base portion 56. Any other shape such as a polygonal shape or an elliptic shape may be also used.

The shape of the indented portion 47 on a side of the pad electrode 45 is defined on the basis of a mask pattern of the pad electrode. Hence, the indented portion 47 is serrated in a direction of circumference of the pad electrode 45 but is not indented in a direction of height of the pad electrode 45.

The indented portion 47 in the circumferential surface of the pad electrode 45 is provided for maximizing the area of the circumferential surface to thereby increase the area of contact between the pad electrode and the translucent electrode. Accordingly, the present invention is different in purpose and operation from inventions (e.g., Japanese Unexamined Patent Publication No. JP-A-H08-340131, Japanese Unexamined Patent Publication No. JP-A-H10-275934, Japanese Unexamined Patent Publication No. JP-A-H10-117017, etc.) which intends to apply currents to the p-type semiconductor layer evenly through an auxiliary electrode extended from the case portion 46 of the pad electrode.

The shape of such serration can be selected optionally. FIG. 4 shows a circle approximated on the basis of a lattice. When, for example, a circle with the radius of 100 μm is approximated on the basis of a lattice with a patch of 3 μm, the length of the circumference of the circle is equal to 100 μm×4. On the other hand, the length of a smooth circle with the radius of 100 μm is equal to 100 μm×3.14. The former is longer by about 27%. Accordingly, even in the case where cracks occur in the interface between the pad electrode and the translucent electrode, the area of contact between the pad electrode and the translucent electrode is enlarged by the enlargement of the interface if the rate of cracks per unit length of the interface is constant. Hence, in simple calculation, the allowable current in the pad electrode according to the present invention is increased by 27%, compared with that in the conventional circular pad electrode. In other words, even in the case where the diameter of the pad electrode according to the present invention is reduced by 27%, the same allowable current as that in the conventional pad electrode can be ensured.

In an example shown in FIG. 5, an indented portion 57 shaped like a square in plan view is provided. In this case, the area of the circumferential surface of the pan electrode 55 is about twice as large as the area of the circumferential surface of the pad electrode having no indented portion 57. Hence, the area of contact with the translucent electrode increases to about twice, so that the allowable current increases to about twice on calculation.

Figure 6A:
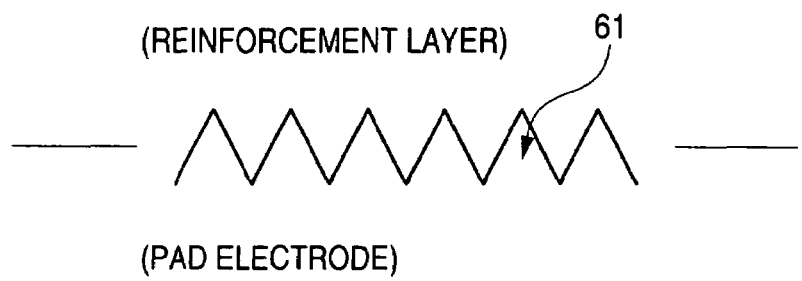
FIGS. 6A to 6D show the configurations of an indented portion of a p-type pad electrode as still further embodiments.
Figure 6B:
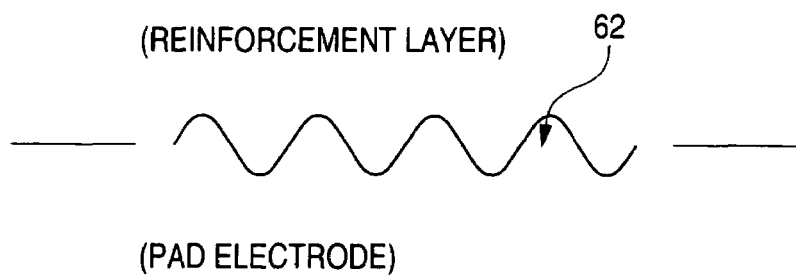
Figure 6C:
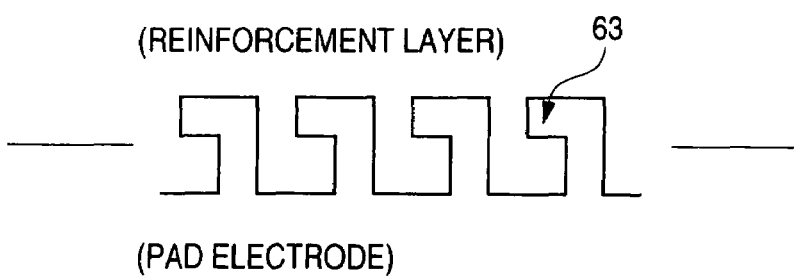
Figure 6D:
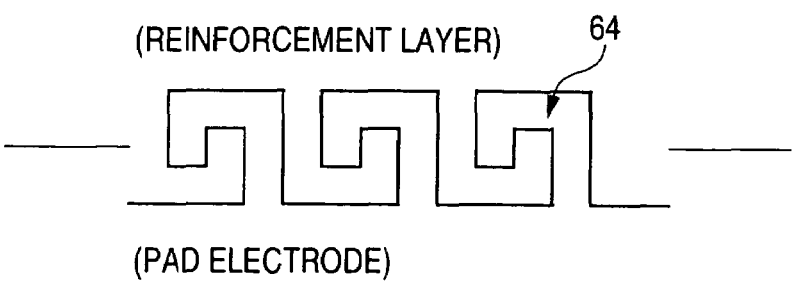

FIGS. 6A to 6D show other examples of the shape of the indented portion formed in the circumferential surface of the pad electrode. The example of the indented portion 61 shown in FIG. 6A is serrated like a saw-teeth shape. The example of the indented portion 62 shown in FIG. 6B is a sine curve. The examples of the indented portions 63 and 64 shown in FIGS. 6C and 6D are hook shapes.

The indented portion is provided for maximizing the area of contact between the pad electrode and the translucent electrode. However, if the amplitude of concavity and convexity is too large, that is, if protrusions are too large, light transmitted through the translucent electrode is shaded by the protrusions undesirably. Therefore, the amplitude of concavity and convexity, that is, the difference between the distance L1 from the center of the pad electrode to a forward end of a protrusion and the distance L2 from the center of the pad electrode to a bottom of a recess adjacent to the protrusion, is preferably set to be in a range of from 2 so 40 μm, more preferably in a range of from 2 to 30 μm, further preferably in a range of from 2 to 15 μm, most preferably in a range of from 3 to 10 μm.

Figure 3A:
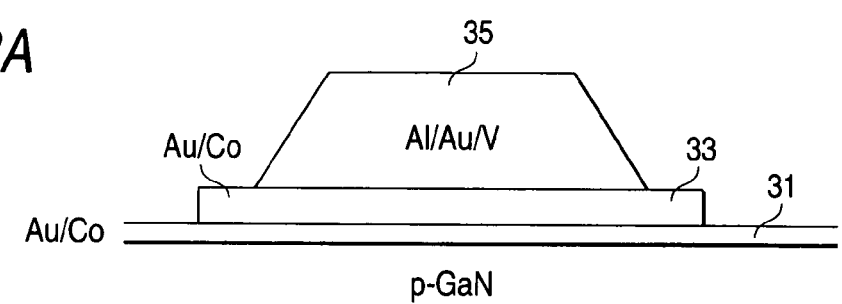
FIGS. 3A and 3B show a method for producing a p-type electrode structure as another embodiment.
Figure 3A:
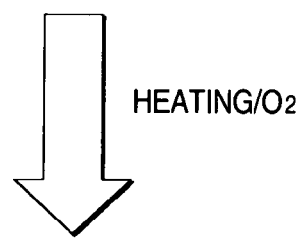
Figure 3B:
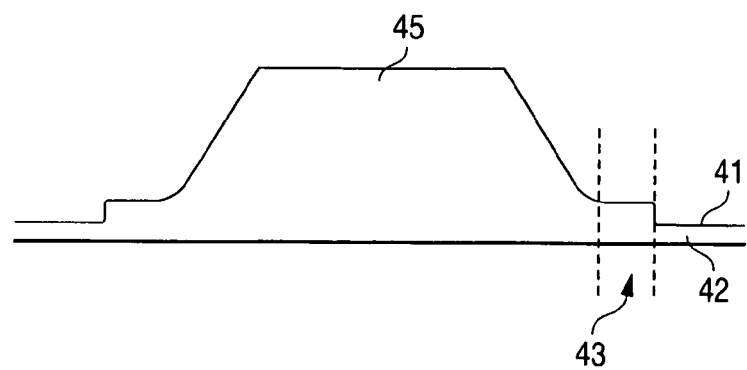

Such an indented portion as preferably formed in the circumferential surface of the pad electrode may be also preferably formed in the outer circumferential surface of each of a thick portion material layer 3 shown in FIG. 1A and a thick portion material layer 33 shown in FIG. 3A for The same purpose and operation. The design concept of the indented portion to be provided in the thick portion material layer is the same as that for the pad electrode.

The circumferential surface of the pad electrode is preferably inclined. That is, the pad electrode 45 (FIG. 4) is shaped like a truncated cone as a whole, and the pad electrode 55 (FIG. 5) is shaped like a truncated quadrangular pyramid as a whole. When the circumferential surface of the pad electrode is tapered, a protective film ($SiO_2$ film) formed on surfaces of the pad electrode and the translucent electrode can be also formed on the tapered portion so that the protective film substantially has such a film thickness as designed.

The material for forming the thin portion occupying a main portion of the translucent electrode 11 is not particularly limited. In the case of a light-emitting device, as shown in FIG. 1A, the translucent electrode 11 is preferably formed by the steps of: sequentially laminating a Co layer as a first electrode layer and an Au layer as a second electrode layer or the lower side to thereby form a translucent electrode material layer 1; and heating the translucent electrode material layer 1 to alloy Co and Au.

It is preferable that the constituent element of the first electrode layer is an element lower in ionization potential than the constituent element of the second electrode layer, and that the constituent element of the second electrode layer is set as an element more excellent in ohmic property with semiconductor than the constituent element of the first electrode layer. A heat treatment is also applied to the electrode layers in order to alloy the electrode layers with the p-type contact layer. By the heat treatment, the element distribution viewed in a depthwise direction from a surface of the semiconductor becomes a distribution formed so that the constituent element of the second electrode layer penetrates more deeply than the constituent element of the first electrode layer. That is, the element distribution of the electrode layers is reverse to the distribution at the time of formation of the electrode layers. After the formation of the electrode layers, the constituent element of the second electrode layer formed on the upper side is located on the lower side whereas the constituent element of the first electrode layer formed on the lower side is located on the upper side.

Preferably, the constituent element of the first electrode layer is at least one kind of element selected from the group consisting of nickel (Ni), cobalt (Co), iron (Fe), copper (Cu), chromium (Cr), tantalum (Ta), vanadium (V) maganese (Mn), aluminum (Al), and silver (Ag). The thickness of the first electrode layer is set to be in a range of from 0.5 to 15 nm. The constituent element of the second electrode layer is at least one kind of element selected from the group consisting of palladium (Pd), gold (Au), iridium (Ir), and platinum (Pt). The thickness of the second electrode layer is set to be in a range of from 3.5 to 25 nm. More especially, the constituent element of the first electrode layer is Co or Ni whereas the constituent element of the second electrode layer is Au. In this case, the element distribution viewed in a depthwise direction from a surface of the semiconductor becomes a distribution formed by the heat treatment so that Au penetrates more deeply than Co or Ni.

Most especially, the first electrode layer is made of Co.

The material for forming the pad electrode is not particularly limited too. In the case of application to a light-emitting device, for example, as shown in FIG. 1A, the pad electrode 15 is preferably formed by the steps of: sequentially laminating a V layer as a first metal layer, an Au layer as a second metal layer and an Al layer as a third metal layer on the lower side to form a pad electrode material layer 5; and heating the pad electrode material layer 5.

The first metal layer is made of an element lower in ionization potential than that of the second metal layer so that the first metal layer can be firmly bonded to a layer thereunder. It is preferable that the second metal layer is made of an element excellent in bonding characteristic to Al or Au and not reactive to the translucent electrode whereas the third metal layer is made of an element firmly bonded to the protective film.

Preferably, the constituent element of the first metal layer is at least one kind of element selected from the group consisting of nickel (Ni), iron (Fe), copper (Cu), chromium (Cr), tantalum (Ta), vanadium (V), manganese (Mn), aluminum (Al), silver (Ag), and cobalt (Co). The thickness of the first metal layer is in a range of from 5 to 300 nm.

Preferably, the constituent element of the third metal layer is at least one kind of element selected from the group consisting of aluminum (Al), nickel (Ni), and titanium (Ti) The thickness of the third metal layer is in a range of from 1 to 30 nm.

Preferably, the constituent element of the second metal layer is gold (Au). The thickness of the second metal layer is in a range of from 300 to 5000 nm.

As shown in FIG. 1A, the thick portion 13 is formed when the ring-like thick portion material layer 3 formed on the translucent electrode material layer 1 is heated. The material nor forming the thick portion material layer 3 is not particularly limited if it can obtain sufficient adhesion to the material of the pad electrode 15 and to the material of the thin portion 12 by heating.

For example, the thick portion material layer 3 can be formed as a combination of a first layer and a second layer. The first layer is made of at least one kind of element selected from the group consisting of nickel (Ni), cobalt (Co), iron (Fe), copper (Cu), chromium (Cr), tantalum (Ta), vanadium (V), manganese (Mn), aluminum (Al), and silver (Ag). The second layer is made of at least one kind of element selected from the group consisting of palladium (Pd), gold (Au), iridium (Ir), and platinum (Pt).

In the case of a light-emitting device, because both the translucent electrode and the pad electrode are often made of a gold alloy, the thick portion material layer 3 is preferably made of a gold alloy. The thick portion material layer 3, however, may be provided as the first layer made of one kind of element selected from the aforementioned thick portion materials if the thick portion material later 3 can obtain sufficient adhesion to the then portion 12 and to the pad electrode 15. Although this embodiment has shown the case where the thick portion material layer 3 is made of the same kind of cobalt-gold alloy as that of the translucent electrode material layer 1, the thick portion material layer 3 may be made of only gold.

The diameter of the thick portion material layer 3 is set as a diameter larger than the diameter of a lower edge of the pad electrode material layer 1, so chat a portion forced out of the lower edge is formed as the thick portion of the translucent electrode 11.

Hence, the thickness of the thick portion material layer is designed in accordance with the required thickness of the thick portion 13. More specifically, the thickness of the thick portion material layer 3 is preferably set to be in a range of 0.5 times to 14 times, more preferably in a range of from 0.5 to 9 times, further preferably in a range of from 1 to 7 times, most preferably in a range of from 1 to 5 times as large as the thickness of the translucent electrode material layer 1.

The outer size of the thick portion material layer 3 is also designed in accordance with the required width of the thick portion 13. The width W of a protruded portion of the thick portion material layer 3 which is goes out from the lower edge of the pad electrode material layer 1 is preferably set to be in a range of from 1 to 30 µm, more preferably in a range of from 2 to 20 µm, further preferably in a range of from 2 to 15 µm, most preferably in a range of from 3 to 10 µm. Because the thick portion 13 is inferior in light transmission characteristic, there is a possibility that light-emitting efficiency of the light-emitting device may be reduced if the width W is larger than 30 µm. in addition, as shown in FIG. 1A, the thick portion 13 is provided for smoothly connecting the circumferential surface of the pad electrode 15 and the thin portion 12 of the translucent electrode 11 to each other by heating. If the width W is smaller than 1 µm, there is a possibility that mechanical strength of the interface between the thin portion 12 and the thick portion 13 becomes insufficient because the joint between the two is precipitous.

Figure 2A:
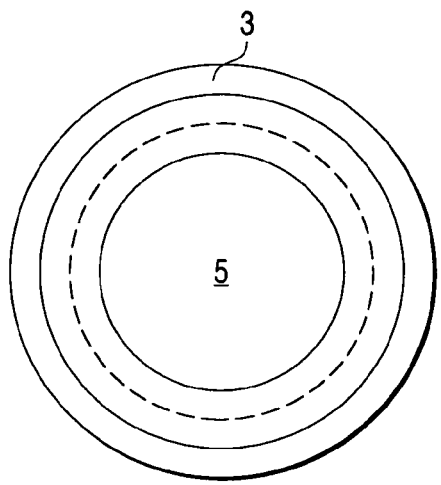
FIG. 2A is a plan view showing an embodiment of the p-type electrode structure.
Figure 2B:
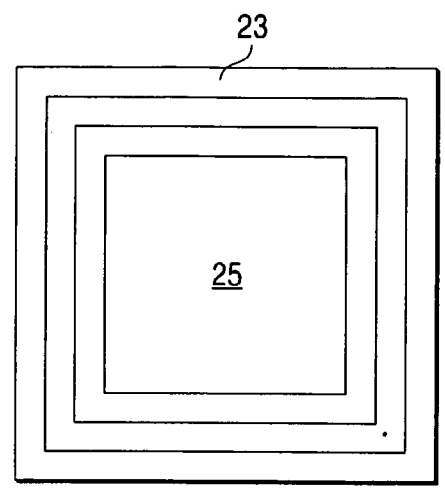
FIG. 2B is a plan view showing another embodiment of the p-type electrode structure.

It is preferable that the width W is uniform on the whole circumference of the pad electrode material layer 1. For this reason, it is preferable that the center of the thick portion material layer 3 and the center of the pad electrode material layer 5 coincide with each other as shown in FIG. 2A. FIG. 2B shows an example of a square pad electrode material layer 25. In the drawing, the reference numeral 23 designates a thick portion material layer.

Further, as shown in FIG. 3A, a flat plate-like thick portion material layer 33 may be also used. A pad electrode material layer 35 is formed on the thick portion material layer 33 so that the centers of the two coincide with each other.

The translucent electrode material layer 1, the thick portion material layer 3 and the pad electrode material layer 5 are alloyed by the heat treatment.

The heat treatment is preferably carried out in the presence of gas containing oxygen. At this title, as the oxygen-containing gas, it is possible to use at least one member or a mixture gas selected from the group consisting of $O_2$, $O_3$, CO, $CO_2$, NO, $N_2O$, $NO_2$, and $H_2O$. Alternatively, it is possible to use a mixture gas of inert gas and at least one member selected from the group consisting of $O_2$, $O_3$, CO, $CO_2$, NO, $N_2O$, $NO_2$, and $H_2O$. Alternatively, it is possible to use a mixture gas of inert gas and a mixture gas selected from the group consisting of $O_2$, $O_3$, CO, $CO_2$, NO, $N_2O$, $NO_2$, and $H_2O$. In short, the oxygen-containing gas means a gas of oxygen atoms or a gas of molecules containing oxygen atoms.

The atmospheric pressure in the heat treatment is preferably not lower than the pressure in which Group III nitride compound semiconductor is not thermally decomposed at the temperature used for the heat treatment When only O gas is used as the oxygen-containing gas, the gas may be preferably fed with pressure not lower than the decomposition pressure of Group III nitride compound semiconductor. When $O_2$ gas is used while mixed with another insert gas, all gases may be preferably fed with pressure not lower than the decomposition pressure of Group III nitride compound semiconductor in the condition that the ratio of $O_2$ gas to all gases is not lower than about $10^{-6}$. In short, only a very small quantity of the oxygen-containing gas existing is sufficient. Incidentally, the upper limit of the quantity of the oxygen-containing gas fed is not particularly limited from the point of view of p-type resistance reducing characteristic and electrode alloying characteristic. In short, the oxygen-containing gas can be used in a range allowing production.

The temperature for the heat treatment is most preferably in a range of from 500 to 600° C. At a temperature of 500° C. or higher, there can be obtained a p-type Group III nitride compound semiconductor which is low in resistance because of perfect saturation of resistivity. On the other hand, at a temperature of 600° C. or lower, electrode alloying can be performed well. The preferred temperature range is from 450 to 650° C.

For materials and heat treatment conditions for forming the pad electrode and the translucent electrode, refer to Japanese Unexamined Patent Publication No. JP-A-H09-320984 and Japanese Unexamined Patent Publication No. JP-A-H10-209493.

In this specification, Group III nitride compound semiconductors are represented by the general formula: $Al_X Ga_Y In_{1-X-Y}N$ ($0 \leq X \leq 1$, $0 \leq Y \leq 1$, $0 \leq X+Y \leq 1$) which includes so-called binary compounds such as AlN, GaN and InN, and so-called ternary compounds such as $Al_xGa_{1-x}N$, $Al_xIn_{1-x}N$ and $Ga_xIn_{1-x}N$ (in the above, $0 \leq x \leq 1$). The Group III elements may be partially replaced by boron (B), thallium (Ti), or the like. The nitrogen (N) may be partially replaced by phosphorus (P), arsenic (As), antimony (Sb), bismuth (Bi), or the like. Each of the Group III nitride compound semiconductors may contain an optional dopant. Si, Ge, Se, Te, C, or the like, can be used as n-type impurities Mg, Zn, Be, Ca, Sr, Ba, or the like, can be used as p-type impurities. Incidentally, the Group III nitride compound semiconductor doped with p-type impurities may be irradiated with electron beams or with plasma or heated in a Furnace. The method for forming the Group III nitride compound semiconductor layers is not particularly limited but the Group III nitride compound semiconductor layers may be formed by a metal organic chemical vapor deposition method (MOCVD method) or may be formed by any other known method such as a molecular beam epitaxy method (MBE method), a halide vapor phase epitaxy method (HVPE method), a sputtering method, an ion-plating method, an electron showering method, etc.

Here, examples of the Group III nitride compound semiconductor device include: optical devices such as a light-emitting diode, a light-receiving diode, a laser diode, a solar cell, etc.; bipolar devices such as a rectifier, a thyristor, a transistor, etc.; unipolar devices such as an FET, etc.; and electronic devices such as a microwave device, etc. In addition, the present invention can be applied also to laminates as intermediate products of these devices.

Incidentally, a homo structure, a hetero structure or a double hetero structure provided with a MIS junction, a PIN junction or a p-n junction may be used as the structure of the light-emitting device. A quantum well structure (single quantum well structure or multiple quantum well structure) may be also used as the light-emitting layer.

An embodiment of the invention will be described below.

Figure 7:
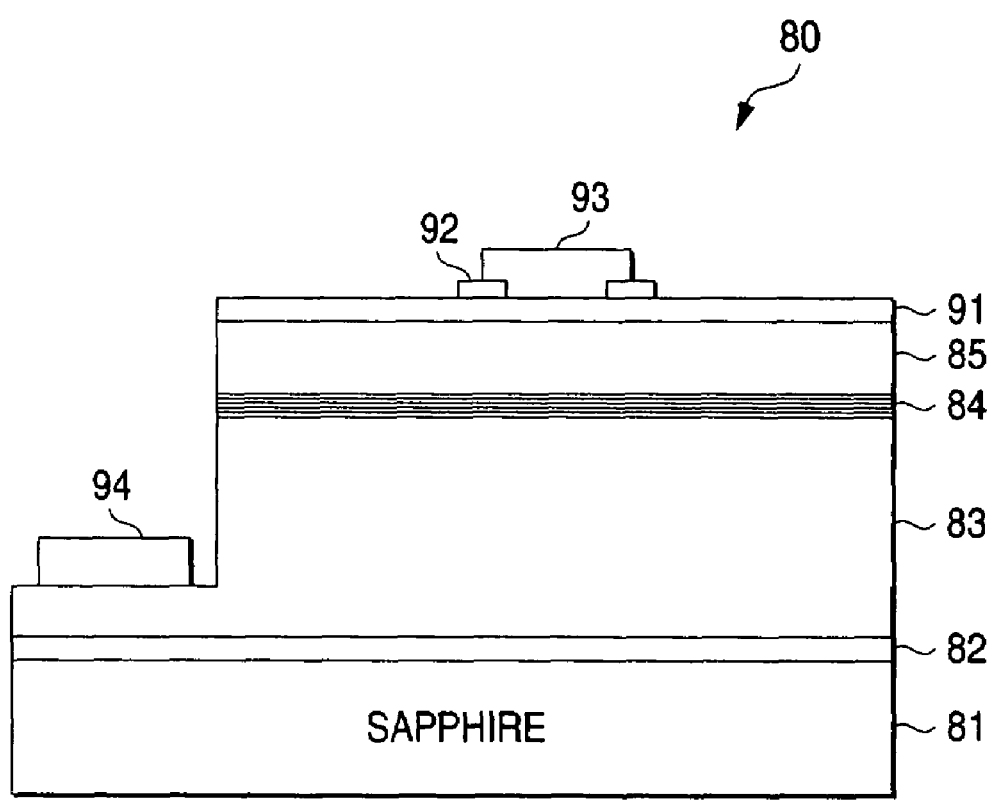
FIG. 7 shows a light-emitting diode as an embodiment of the invention.

This embodiment is a light-emitting diode 80, the configuration of which is shown in FIG. 7. Respective layers are as follows.

| Layer | Composition | Dopant | (Thickness) |
|---|---|---|---|
| Translucent electrode 91 | | | |
| p-type clad layer 85 | p-GaN | Mg | (0.3 μm) |
| Light-emitting layer 84 | Superlattice structure | | |
| Quantum well layer | $In_{0.15}Ga_{0.85}N$ | | (3.5 nm) |
| Barrier layer | GaN | | (3.5 nm) |
| The number of iterations of the quantum well layer and the barrier layer | 1 to 10 | | |
| n-type clad layer 83 | n-GaN | Si | (4 μm) |
| AlN buffer layer 82 | AlN | | (60 nm) |
| Substrate 81 | sapphire (surface a) | | (300 μm) |

The n-type clad layer 83 may be of a double-layered structure with an n− layer of a low electron density on the light-emitting layer 84 side and an n+ layer of a high electron density on the buffer layer 82 side. The latter is called n-type contact layer.

The light-emitting layer 84 is not limited to the superlattice structure. A single or double hetero type structure, a homo-junction type structure, or the like, may be used as the structure of the light-emitting device.

A layer of a Group III nitride compound semiconductor which has a wide band gap and which is doped with an acceptor such as magnesium may be interposed between the light-emitting layer 84 and the p-type clad layer 85. This is used for preventing electrons injected into the light emitting layer 84 from diffusing into the p-type clad layer 85.

The p-type clad layer 85 may be of a double-layered structure with a p− layer of a low hole density on the light-emitting layer 84 side and a p+ layer of a high hole density on the electrode side. The latter is called p-type contact layer.

In the light-emitting diode configured in the aforementioned manner, each of the Group III nitride compound semiconductor layers is formed by execution of MOCVD in a general condition.

Then, a mask is formed and the p-type clad layer 85, the active layer 84 and the n-type clad layer 83 are partially removed by reactive ion etching to thereby reveal the n-type clad layer 83 on which the n-type pad electrode 94 is to be formed.

The translucent electrode material layer 91, the thick portion material layer 92 and the pad electrode material layers 93 and 94 are formed by a lift off method.

A photo resist is applied on the semiconductor layer surface evenly and then partially removed from an electrode-forming portion on the p-type clad layer 85 by photolithography to thereby reveal this portion of the p-type clad layer 85. A Co layer (1.5 nm) and an Au layer (6.0 nm) are laminated successively on the exposed p-type clad layer 85 by a vapor deposition apparatus to thereby form a translucent electrode maternal layer 91.

Then, a Co layer (3.0 nm) and an Au layer (6.0 nm) are laminated successively by the same lift-off method to thereby form a thick portion material layer 92. Incidentally, the thick portion material layer 92 is shaped like a circular ring.

Then, a V layer (17.5 nm), an Au layer (1.5 μm) and an Al layer (10 nm) are laminated successively by the same lift-off method to thereby form a p-type pad electrode material layer 93. It is preferable that indentation is formed in the circumferential edge of the opening portion of a mask used in this case.

An n-type pad electrode material layer 94 made of a combination of vanadium and aluminum is formed in the same manner as described above.

The sample obtained in the aforementioned manner is put into a heating furnace. The furnace is evacuated to 1 Pa or less. Then, $O_2$ is supplied into the furnace up to ten and several Pa. In this state, the furnace temperature is set at 55° C. and heat treatment is carried out for about 4 minutes. Hence, as shown in FIGS. 1A, 1B, 3A and 3B, respective materials of the translucent electrode material layer 91, the thick portion material layer 92 and the pad electrode material layer 33 are alloyed and the layers are connected to one another to thereby form a p-type electrode structure. According to the inventors' examination, there is little current fed into the p-type clad layer just under the p-type pad electrode. It is supposed that this is because the aforementioned distribution inversion does not occur in the Au/Co vapor deposition layers constituting the translucent electrode just under the p-type pad electrode so that contact resistance becomes relatively high. Hence, the interface between the circumferential surface of the p-type pad electrode and the translucent electrode becomes a surface effective in electrically connecting the two to each other. That is, the current applied in to the p-type pad electrode flows into the thick portion of the translucent electrode through the circumferential surface of the p-type pad electrode. The current is further diffused from the thick portion into the whole surface of the thin portion and fed into the whole surface of the p type semiconductor layer evenly.

Then, a protective film of silicon dioxide is formed on the surface of the sample except bonding window portions by vapor deposition. Any protective film can be used if it has translucency and electrically insulating characteristic $TiO_2$, $Al_2O_3$, $Si_3N_4$, etc. may be used, besides $SiO_2$. Alternatively, the protective film may be formed by sputtering or CVD.

The invention is not limited to the description of the mode for carrying out the invention and the embodiment thereof at all, but includes various modifications that can be easily conceived by those skilled in the art, without departing from the claims for a patent.

What is claimed is:

1. A Group III nitride compound semiconductor device, comprising:
   a translucent electrode comprising a thick portion and a residual portion, said residual portion comprising a thickness which is less than a thickness of said thick portion, and said thick portion being formed on a circumferential surface of a p-type pad electrode.

2. A Group m nitride compound semiconductor device according to claim 1, wherein said thick portion of said translucent electrode comprises a material different from that of said residual portion of said translucent electrode.

3. A Group III nitride compound semiconductor device according to claim 1, wherein said translucent electrode comprises a cobalt-gold alloy.

4. A Group III nitride compound semiconductor device according to claim 2, wherein a thickness of said residual portion of said translucent electrode is in a range of from 4 nm to 40 nm, and
   wherein a thickness of said thick portion is in a range of from 1.5 times to 15 times the thickness of said residual portion.

5. A Group III nitride compound semiconductor device according to claim 4, wherein a width of said thick portion is in a range of from 1 μm to 30 μm.

6. A Group III nitride compound semiconductor device according to claim 1, wherein said device has a structure of one of a light-emitting device and a light-receiving device.

7. A translucent electrode in a Group III nitride compound semiconductor device, comprising:
   a thick portion; and
   a residual portion having a thickness which is less than a thickness of said thick portion, wherein said thick portion is formed on a circumferential surface of a p-type pad electrode.

8. A translucent electrode according to claim 7, wherein said thick portion comprises a material different from that of said residual portion of said translucent electrode.

9. A translucent electrode according to claim 7, wherein said thick portion comprises a cobalt-gold alloy.

10. A translucent electrode according to claim 8, wherein a thickness of said residual portion is in a range of from 4 nm to 40 nm, and
    wherein a thickness of said thick portion is in a range of from 1.5 times to 15 times the thickness of said residual portion.

11. A translucent electrode according to claim 10, wherein a width of said thick portion is in a range of from 1 μm to 30 μm.

12. A p-type electrode structure, comprising:
    a translucent electrode and a pad electrode formed on a p-type semiconductor layer in a Group III nitride compound semiconductor device,
    wherein said translucent electrode comprises a thick portion and a residual portion said residual portion comprising a thickness which is less than a thickness of said thick portion, and said thick portion being formed on a circumferential surface of said pad electrode.

13. A p-type electrode structure according to claim 12, wherein said thick portion of said translucent electrode comprises a material different from that of said residual portion of said translucent electrode.

14. A p-type electrode structure according to claim 12, wherein said translucent electrode comprises a cobalt-gold alloy.

15. A p-type electrode structure according to claim 13, wherein a thickness of said residual portion of said translucent electrode is in a range of from 4 μm to 40 nm whereas a thickness of said thick portion is in a range of from 1.5 times to 15 times the thickness of said residual portion.

16. A p-type electrode structure according to claim 12, wherein a width of said thick portion is in a range of from 1 μm to 30 μm.

17. A p-type electrode structure according to claim 12, wherein said circumferential surface of said pad electrode comprises an indented portion.

18. A Group III nitride compound semiconductor device according to claim 1, wherein said residual portion is formed adjacent to said thick portion.

19. A Group III nitride compound semiconductor device according to claim 2, wherein said thick portion and said residual portion are continuously formed.

20. A Group III nitride compound semiconductor device according to claim 1, wherein said thick portion of said translucent electrode contacts a side surface of said p-type pad electrode.

21. A p-type electrode structure according to claim 17, wherein said circumferential surface comprises a circumferential side surface, and
    wherein said indented portion comprises one of a saw-toot shaped portion, a wave-shaped portion and a hook-shaped portion.

22. A Group III nitride compound semiconductor device comprising:
    a pad electrode; and
    a translucent electrode having a varying thickness and comprising a thick portion which is formed on a side surface of said pad electrode.

23. A p-type electrode structure, comprising:
    a pad portion; and
    a translucent portion having a varying thickness and comprising a thick portion which is formed on a side surface of said pad portion.

24. A Group III nitride compound semiconductor device according to claim 1, wherein said p-type pad electrode is formed on said thick portion of said translucent electrode and has an area which is smaller than an area of said thick portion.

25. A Group III nitride compound semiconductor device according to claim 1, wherein an area of said thick portion of said translucent electrode is within an area of said residual portion of said translucent electrode.

26. A Group m nitride compound semiconductor device according to claim 1, wherein said translucent electrode is formed around a bottom sidewall portion of said p-type pad electrode.

27. A Group III nitride compound semiconductor device according to claim 1, wherein said translucent electrode and said p-type pad electrode comprise a gold alloy.

28. A Group m nitride compound semiconductor device according to claim 1, wherein said p-type pad electrode comprises a tapered sidewall, and said thick portion of said translucent electrode adjoins a bottom of said tapered sidewall of said p-type pad electrode.

29. A Group III nitride compound semiconductor device according to claim 1, wherein a center of said p-type pad electrode substantially coincides with a center of said thick portion of said translucent electrode.

30. A Group III nitride compound semiconductor device according to claim 1, wherein said thick portion of said translucent electrode has a substantially uniform width.

31. A Group III nitride compound semiconductor device according to claim 1, wherein an interface between said translucent electrode and said p-type pad electrode comprises an alloy of a material of said translucent electrode and a material of said p-type pad electrode.

32. A Group III nitride compound semiconductor device according to claim 1, wherein said thick portion of said translucent electrode is formed around a periphery of said p-type pad electrode.

* * * * *